(12) United States Patent
Jacobs et al.

(10) Patent No.: US 8,314,328 B1
(45) Date of Patent: Nov. 20, 2012

(54) SOLAR ENERGY COLLECTING APPARATUS AND METHOD

(75) Inventors: William A Jacobs, Lake Worth, FL (US); Allen D Hertz, Boca Raton, FL (US)

(73) Assignee: MicroGlo, LLC, Boynton Beach, FL (US)

(\*) Notice: Subject to any disclaimer, the term of this patent is extended or adjusted under 35 U.S.C. 154(b) by 479 days.

(21) Appl. No.: 12/549,348

(22) Filed: Aug. 27, 2009

Related U.S. Application Data

(60) Provisional application No. 61/114,053, filed on Nov. 12, 2008.

(51) Int. Cl.
*H01L 31/0203* (2006.01)
(52) U.S. Cl. ......... 136/259; 136/251; 136/244; 136/246
(58) Field of Classification Search .................. 136/246, 136/251, 259, 244; 438/64
See application file for complete search history.

(56) References Cited

U.S. PATENT DOCUMENTS

| | | | | |
|---|---|---|---|---|
| 4,217,147 | A * | 8/1980 | Ziemba | 136/248 |
| 2003/0201008 | A1* | 10/2003 | Lawheed | 136/246 |
| 2007/0169804 | A1* | 7/2007 | Nakata | 136/250 |
| 2007/0193620 | A1* | 8/2007 | Hines et al. | 136/246 |
| 2007/0251569 | A1* | 11/2007 | Shan et al. | 136/246 |
| 2008/0178927 | A1* | 7/2008 | Brezoczky et al. | 136/248 |

\* cited by examiner

*Primary Examiner* — Jennifer Michener
*Assistant Examiner* — Jayne Mershon
(74) *Attorney, Agent, or Firm* — Allen D. Hertz, P.A.; Allen D. Hertz

(57) ABSTRACT

A solar energy collection device includes a solar converting station housing having a concentrator for aiding in focusing the energy onto a photovoltaic material. The photovoltaic material is applied to a series of cylindrically shaped power cells. A series of the power cells are rotationally assembled to the solar energy collection device. The power cells rotate about the cell axles, providing a cooling process for the photovoltaic material. The rotation can be provided via any number of means. The series of the power cells can be built in a removable assembly, providing a power pack for the end user.

21 Claims, 7 Drawing Sheets

SOLAR ENERGY COLLECTING APPARATUS AND METHOD

RELATED US PATENT APPLICATION

This Non-Provisional Patent Application claiming priority to Provisional U.S. Application 61/114,053, filed Nov. 12, 2008, which is incorporated in its entirety by reference herein.

BACKGROUND OF THE INVENTION

1. Field of the Invention

The present invention relates to a solar energy collecting apparatus, more specifically to a device and method using a plurality of photovoltaic covered cylinders being rotatably exposed to the light source.

2. Discussion of the Related Art

This invention relates to a solar energy power conversion and collection system. Current solar power conversion systems utilising light concentration or amplification devices such as a magnifying lens, mirrors and the like. The light is focus upon a photovoltaic material. One of the limitations of this configuration is a constraint cause by the properties of the photovoltaic material. The material degrades when subjected to elevated temperatures.

Solar energy concentration devices are known, such as presented in the teachings of Hoffman, et al. (U.S. Pat. No. 4,356,813), Johnson (U.S. Pat. No. 4,896,656), and Rabinowitz (U.S. Pat. No. 7,133,183). Hoffman teaches a series of reflecting walls for concentrating solar energy onto a photovoltaic surface. Johnson teaches a similar concept in a different configuration.

SUMMARY OF THE INVENTION

The present invention is directed to a solar energy collection device incorporating a concentrator for aiding in focusing the energy onto the photovoltaic material. The photovoltaic material is deposited on a cylindrically shaped power cell. A plurality of the power cells is rotationally assembled to a central framework of cell axles. The power cells rotate about the cell axles, providing a cooling process for the photovoltaic material. The rotation can be provided via any number of means.

In a first aspect of the present invention, a solar energy collection device is defined comprising:
  a solar converting station housing;
  a light concentrating assembly that amplifies inbound light and directs the light towards solar power conversion members;
  the solar power conversion members comprising:
    a power cell comprising a photovoltaic layer laminated upon a cell body;
    a plurality of power cells assembled providing a rotational motion about an cell axis along a plane that is generally perpendicular to the concentrated direction of the light; and
    a drive apparatus for rotating each of the plurality of power cells about the cell axis.

While another aspect of the present invention incorporates a battery within the power cell.

With another aspect of the present invention provides a rotational means to the power cells via rotating an assembly. The rotation causes the power cells to rotate via any of the following:
  a. a gear configuration engaging directly with each cell,
  b. friction between each cell and a second object,
  c. moving the cell while in contact with a second object, and
  d. moving the second object while in contact with the cell.

While yet another aspect incorporates an electromagnet within at least one power cell.

Yet another aspect incorporates a power storage device, such as a battery, a capacitor, and the like within at least one power cell.

Wherein another aspect incorporates side supports located against a side region of each of the pressure vessels, thus limiting the expansion under pressure to a linear dimension, compared to a radial expansion.

Another aspect provides a removable power cell assembly providing a portable power source and a respective solar recharging station.

In another aspect, the station incorporates a fan for cooling the non-solar side of the power cells.

These and other features, aspects, and advantages of the invention will be further understood and appreciated by those skilled in the art by reference to the following written specification, claims and appended drawings, which follow.

BRIEF DESCRIPTION OF THE DRAWINGS

For a fuller understanding of the nature of the present invention, reference should be made to the accompanying drawings in which.

Like reference numerals refer to like parts throughout the several views of the drawings.

DETAILED DESCRIPTION OF REPRESENTATIVE EMBODIMENTS

Figure 1:
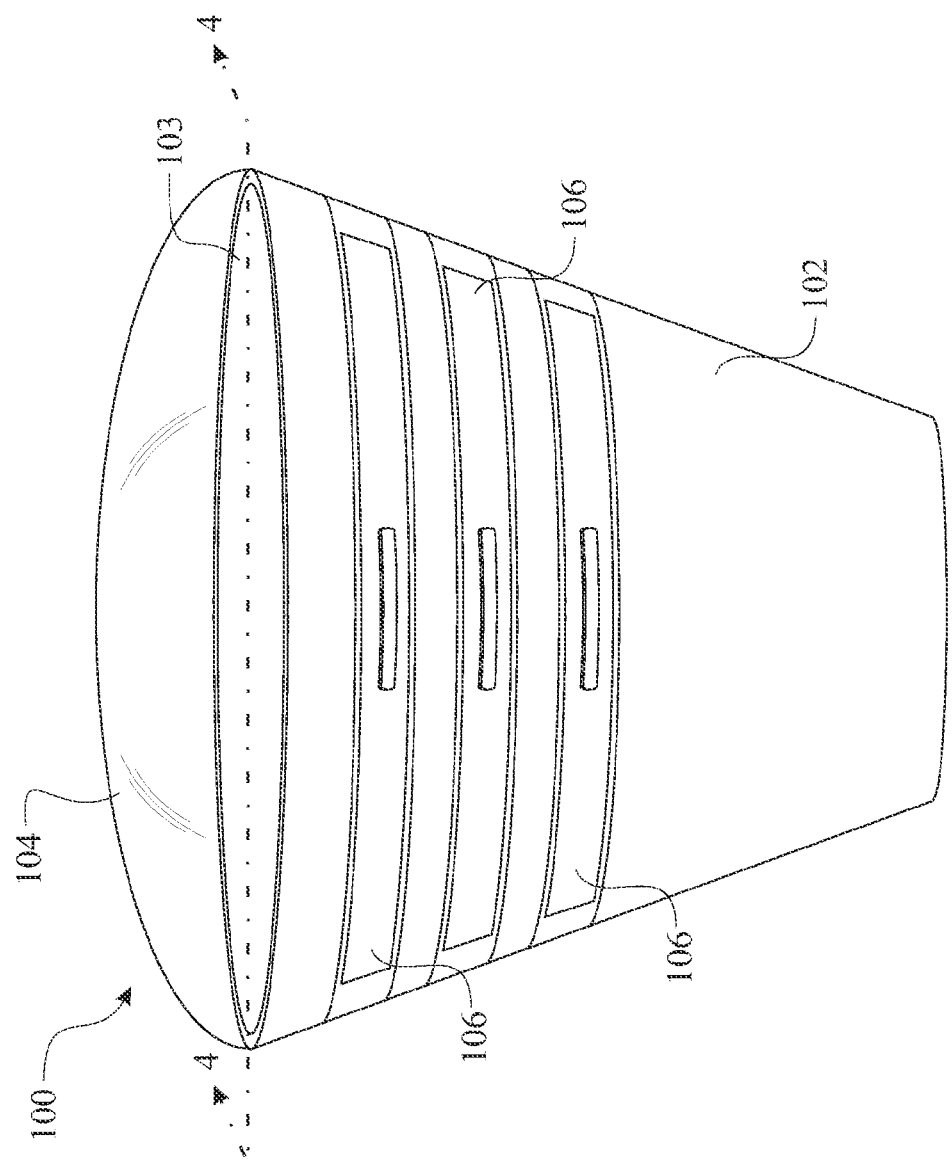
FIG. 1 presents an isometric view of an exemplary embodiment of a solar power collecting station.
Figure 2:
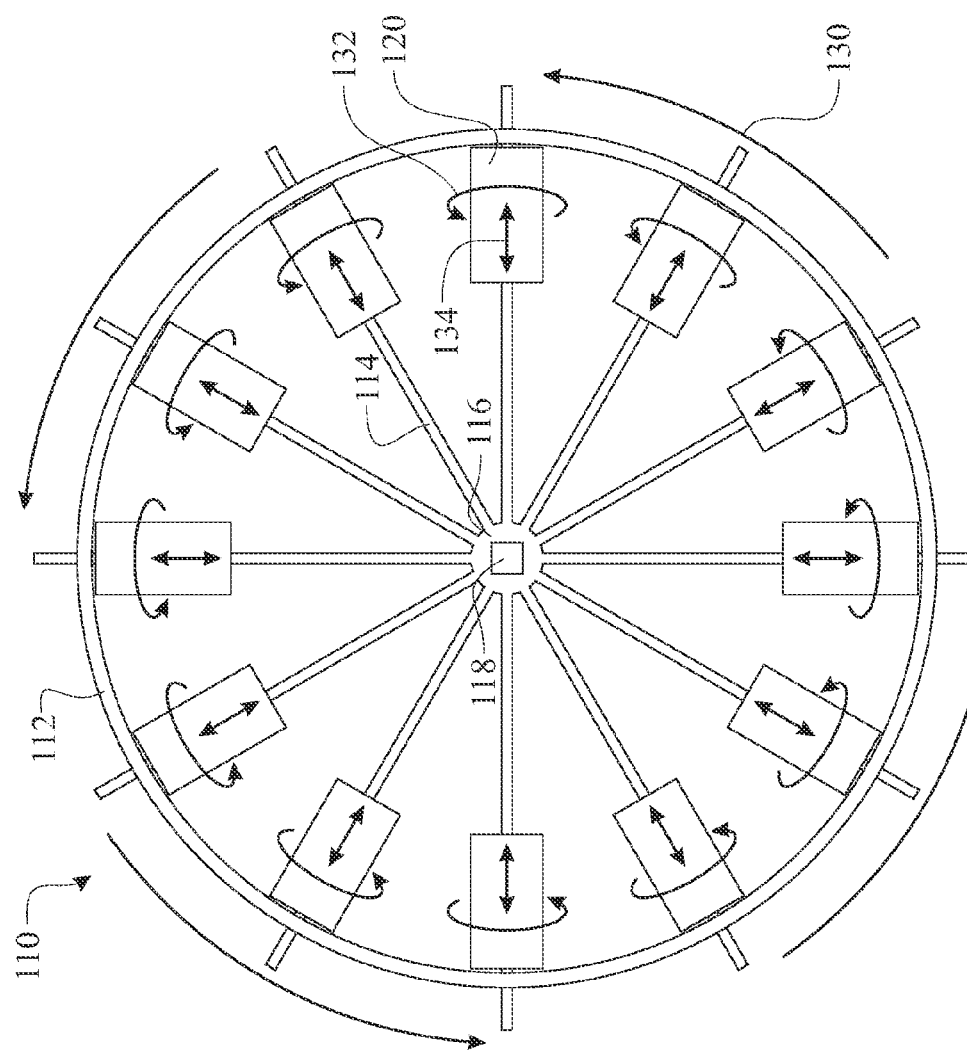
FIG. 2 presents a top planar view of an exemplary embodiment of a power cell assembly for use in conjunction with the solar power collecting station of FIG. 1.

For purposes of description herein, the terms "upper", "lower", "left", "rear", "right", "front", "vertical", "horizontal", and derivatives thereof shall relate to the invention as oriented in FIG. 1. However, one will understand that the invention may assume various alternative orientations and step sequences, except where expressly specified to the contrary. Therefore, the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 3:
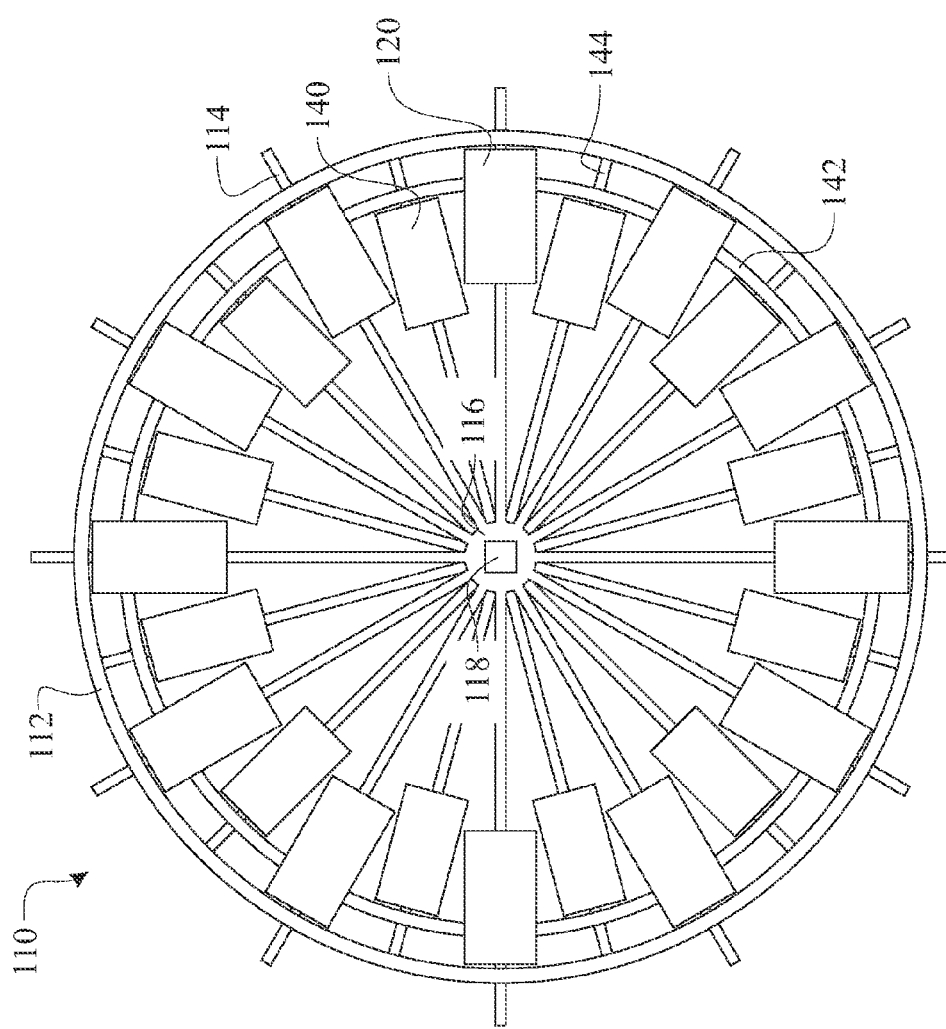
FIG. 3 presents a top planar view of a plurality of power cell assemblies.
Figure 4:
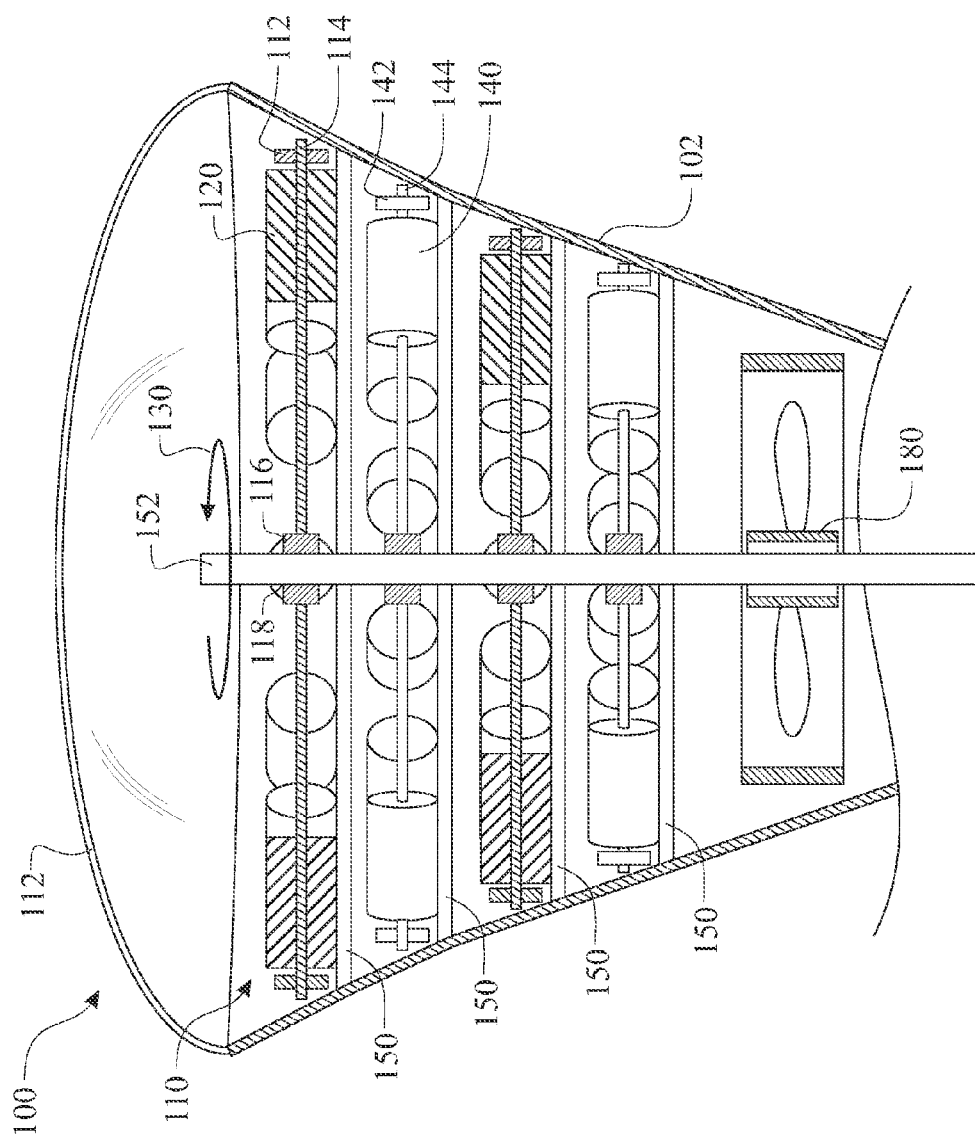
FIG. 4 presents a sectional view of the exemplary solar power collecting station taken along section 4-4 of FIG. 1.
Figure 5:
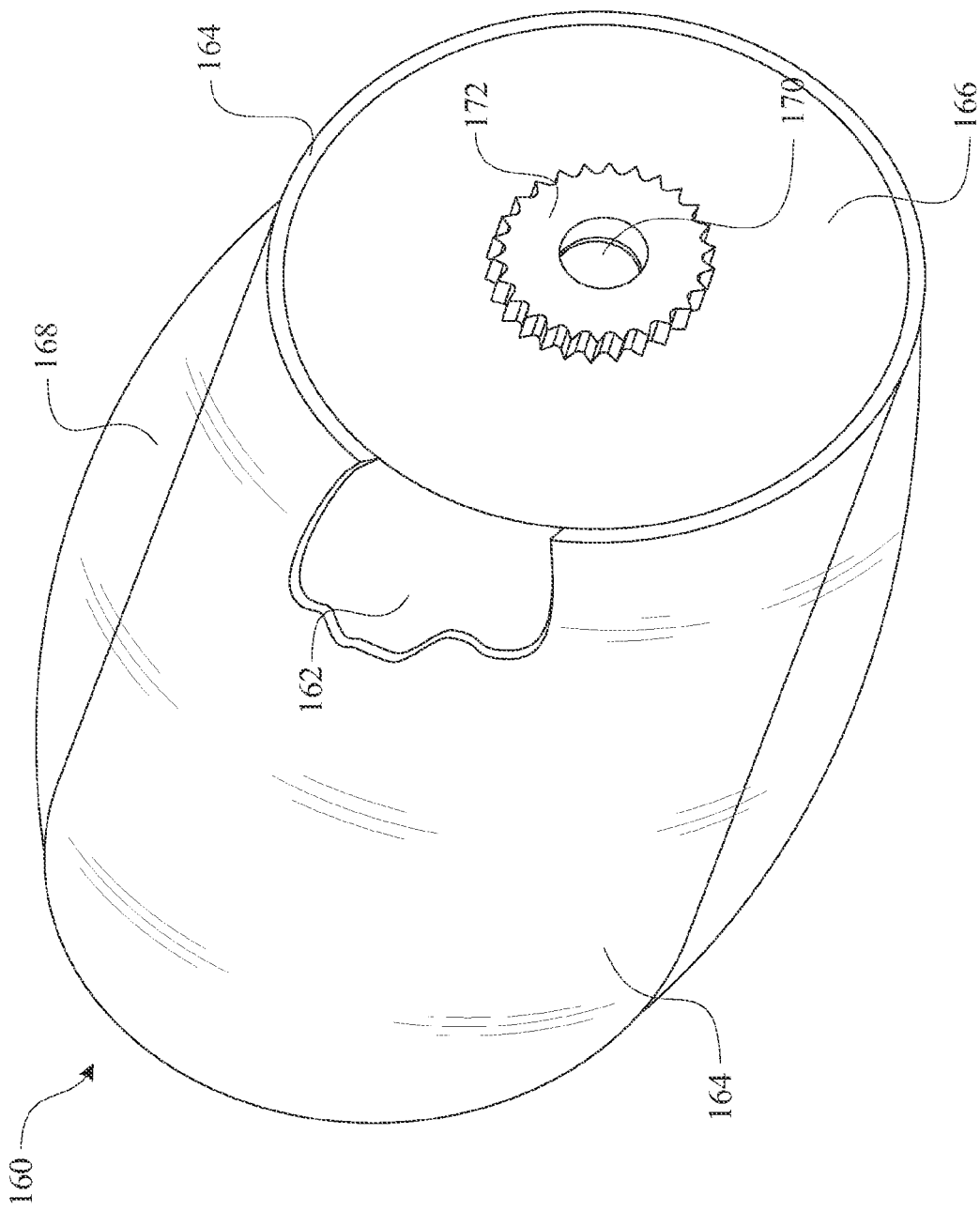
FIG. 5 presents an isometric view of a power cell assembly incorporating a single light concentrator.

An exemplary embodiment of the present invention is referred to as a solar power converting station 100 and illustrated in FIGS. 1 through 4, with a detailed view of an enhanced power cell assembly 160 presented in FIG. 5. The solar power converting station 100 comprises a solar converting station housing 102 having an upper opening 103 spanning across the upper region. The solar power converting station 100 preferably incorporates a light concentration component 104 at least partially covering the upper opening 103. The light concentration component 104 can be of any known or inventive configuration for concentrating the presented light onto the solar receptacles. Although the illustrative embodiment is a magnifying lens, it is recognized that mirrors, a series of mirrors, a combination of mirrors and lenses, and the like can be utilized.

The solar power converting station 100 incorporates at least one power cell assembly 110. The power cell assembly 110 is an assembly comprising at least one solar collecting power cell 120 rotatably assembled to a cell axle 114. The power cell assembly 110 can be formed having a plurality of cell axles 114 arranged radially spanning between a central axles hub 116 and a pack external frame 112. A solar collecting power cell 120 can be rotatably assembled to each of the cell axles 114. A central shaft engaging port 118 can be provided in the center of the central axles hub 116. The central shaft engaging port 118 engages with a central shaft 152, wherein the central shaft 152 provides a rotational force to the power cell assembly 110 directing the power cell assembly 110 to rotate in accordance with an assembly rotation 130. The solar collecting power cell 120 are in contact with a optional drive plate 150, with the friction causing the solar collecting power cell 120 to rotate about the cell axles 114 in accordance with a power cell rotation 132. This motion exposes an upper surface of the solar collecting power cell 120 to the incoming light, placing a lower surface facing a cooling fan 180.

The photovoltaic material applied to the exterior of the solar collecting power cell 120 converts solar energy to electrical energy. Each of the solar collecting power cells 120 would be in electrical communication with a power outlet interface. The electrical energy can be distributed through an electrical connection to a power storage device such as a battery, transferred to a power grid, or combination therein. An exemplary configuration incorporates a battery within each solar collecting power cell 120. The power cell assembly 110 can be removable, such as via a power pack drawer 106, becoming a power pack for use with other electronically driven devices. Additionally, the designer can incorporate an electro-magnet within the solar collecting power cell 120, utilising the rotating motion to generate additional electrical energy. It is understood that additional electrical power control components such as fuses, circuit breakers, and the like can be incorporated for power management and safety.

One exemplary embodiment of the power cell assembly 110 is presented herein. It is understood that the optional drive plate 150 can rotate, while the power cell assembly 110 remains stationary. The optional drive plate 150 and the power cell assembly 110 can both rotate, each rotating at a different speed and/or direction respective to each other. Alternately, the solar collecting power cell 120/enhanced power cell assembly 160 can include a rotational drive gear 172 or other means driving the rotation of the solar collecting power cell 120 about the cell axles 114. The cell axles 114 can be of any form factor or other coupling interface to the pack external frame 112. The illustrated embodiment allows the solar collecting power cell 120 to adjust longitudinally, in accordance with a power cell radial motion 134. The cell axles 114 can be telescoping allowing the power cell assembly 110 to collapse inwardly for storage or reduction of the cross sectional area for protection during storms or other potentially damaging conditions.

The optional drive plate 150 can be of any material and form factor, preferably being porous and of a material or fabrication allowing the light to transmit through.

In the preferred embodiment, the solar power converting station 100 incorporates a plurality of power cell assembly 110 oriented in a stacked configuration as presented in FIGS. 3 and 4. It is preferred to align each power cell assembly 110 with the solar collecting power cell 120, 140 offset from each other optimizing exposure to the inbound light. The upper power cell assembly 110 comprising the components as previously described. The adjacent lower power cell assembly 110 comprising similar components, referenced as a secondary power cell 140, secondary pack external frame 142, and a secondary cell axles 144. Each power cell assembly 110 would have a different diameter compared to the adjacent power cell assembly 110. The diameter can be smaller as the layers continue towards the base or increasing forming an inverted cone.

Figure 6:
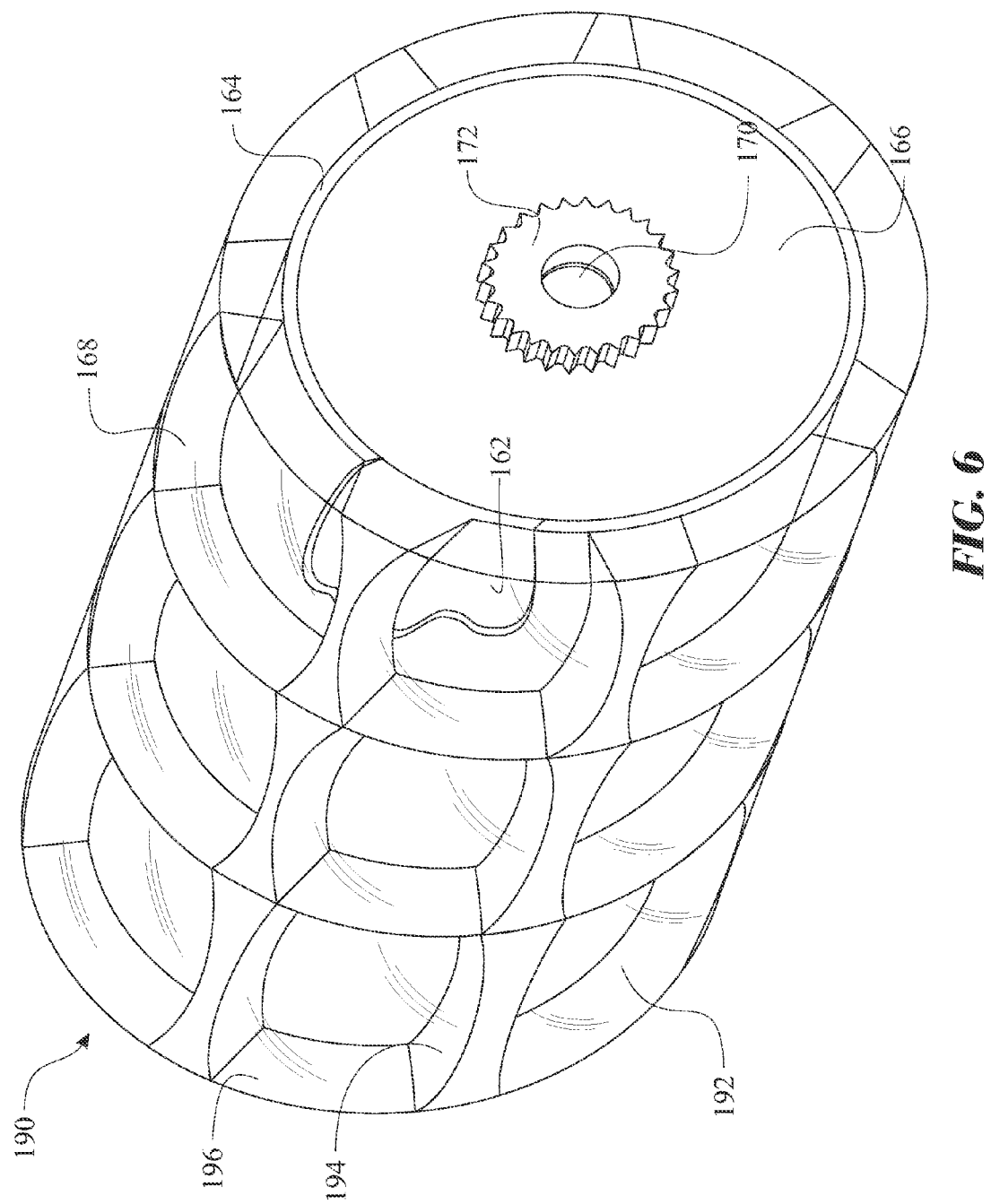
FIG. 6 presents an isometric view of a power cell assembly incorporating a plurality of light concentrators.

The solar collecting power cell 120, 140 can include the features illustrated in an enhanced power cell assembly 160 as illustrated in FIGS. 5 and 6. The enhanced power cell assembly 160 is fabricated having a cylindrically shaped power cell body 162. A body end walls 166 can be provided on each end of the cylindrically shaped power cell body 162. A photovoltaic layer 164 is laminated to the exterior surface of the cylindrically shaped power cell body 162. A cell axis 170 is formed through at least one body end walls 166 and projects inward or completely through the cylindrically shaped power cell body 162. An optional cell magnifying layer 168 can be provided coating the exterior of the cell magnifying layer 168 (FIG. 5) providing additional concentration of the inbound light. Alternately, a concentrator can be assembled to the power cell assembly 110 between the light source and each solar collecting power cell 120 in addition to the light concentration component 104. Yet another concentrator can utilise tapered fibers. While another exemplary concentrating configuration can use a plurality of magnifying plates 192. The magnifying plates 192 are assembled to the enhanced power cell assembly 190 via a grid having a series of circumferential magnifier support ribs 196 arranged circumferentially and a series of longitudinal magnifier support members 194 arranged axially. The walls of the longitudinal magnifier support members 194 and circumferential magnifier support ribs 196 can have a finish to help reflect the light towards the photovoltaic layer 164. One example would be a mirrored finish. An optional rotational drive gear 172 can be provided at one end of the enhanced power cell assembly 160 for interfacing with a drive mechanism directing the enhanced power cell assembly 160 to rotate in accordance with the power cell rotation 132. Alternate rotational interfaces and drive mechanisms can be utilised, such as a "Lazy Susan" style bearing ring, and the like.

It is recognized that a solar power converting station 100 can be of any of a variety of form factors and details incorporating the same generic concept. Concentrated light energy, which is focused onto a photovoltaic material causing the temperature of the photovoltaic material to increase. This present invention provides the photovoltaic material on a cylindrical body that rotates. The rotation step positions a portion of the photovoltaic material for receiving the light and the remainder of the photovoltaic material is positioned for cooling. The rotation can be provided in any reasonable means suggested by one skilled in the art.

Figure 7:
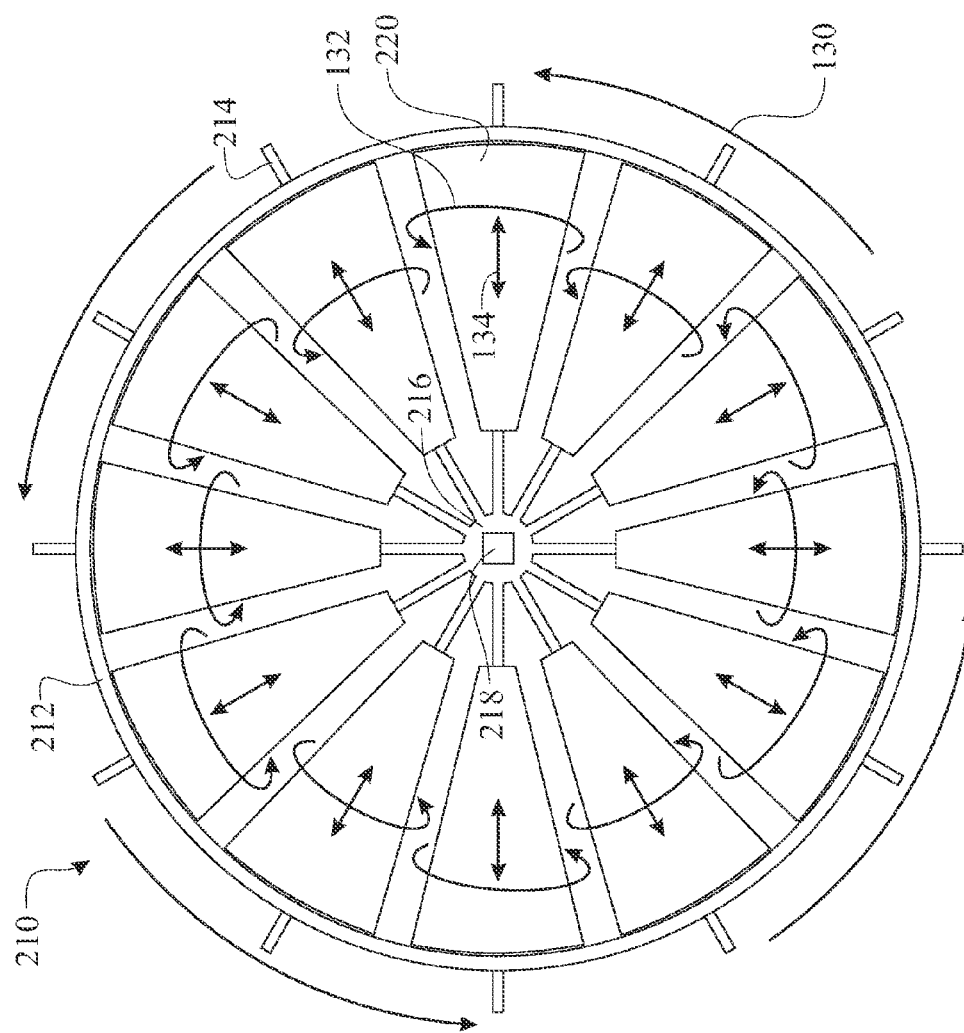
FIG. 7 presents a top planar view of an alternate exemplary power cell assembly.

To provide improved efficiency, the solar power converting station 100 can employ a series of layers of the power cell assembly 110. Alternately, the solar cell assemblies 220 can be formed having a taper as illustrated in FIG. 7. The conical or tapered shape provides a denser distribution of the photovoltaic material across the assembly. The dense power cell assembly 210 would comprise features as described previously, including a pack external frame 212, a cell axles 214, a central axles hub 216, and a central shaft engaging port 218. The optional drive plate 150 could be formed having an angled contacting surface, ensuring continuous contact between the optional drive plate 150 and the conical solar collecting power cell 220.

The above description is considered that of the preferred embodiments only. Modifications of the invention will occur to those skilled in the art and to those who make or use the invention. Therefore, it is understood that the embodiments shown in the drawings and described above are merely for illustrative purposes and are not intended to limit the scope of the invention, which is defined by the following claims as interpreted according to the principles of patent law, including the doctrine of equivalents.

We claim:

1. A solar power collecting station, the station comprising:
    a solar converting station housing;
    a light concentrating assembly that amplifies inbound light and directs the light towards at least one solar power conversion assembly located within the housing;
    each solar power conversion assembly comprising:
        a power cell having a photovoltaic layer laminated upon a cell body, wherein a portion of the photovoltaic layer on the cell body is exposed to the inbound light and a portion of the photovoltaic layer on the cell body faces the lower surface of the station housing;
        a plurality of power cells assembled providing a rotational motion about an cell axis along a plane that is generally perpendicular to the concentrated direction of the light; and
        a drive apparatus engaging with the plurality of power cells causing the power cells to rotate about their longitudinal axis rotating each of the power cells, wherein the portion of the photovoltaic layer on the cell body previously directed to the lower surface of the station is rotated to be exposed to the incoming light and the photovoltaic layer on the cell body previously exposed to the incoming light is rotated to face the lower surface of the station.

2. A solar power collecting station as recited in claim 1, the station further comprising a cooling apparatus which cools a portion of the photovoltaic layer of the power cell which is rotated away from exposure to the concentrated light.

3. A solar power collecting station as recited in claim 2, wherein the cooling apparatus is a fan.

4. A solar power collecting station as recited in claim 1, wherein the drive apparatus is a series of gears.

5. A solar power collecting station as recited in claim 1, wherein the power cells are conically shaped, wherein the conical axis extends the their longitudinal axis.

6. A solar power collecting station as recited in claim 1, the power cells are arranged in a first planar layer being generally perpendicular to the concentrated direction of the light and a second planar layer being parallel to and below the first planar layer.

7. A solar power collecting station as recited in claim 6, wherein the power cells of the first planar layer are staggered respective to the power cells of the second layer.

8. A solar power collecting station, the station comprising:
    a solar converting station housing;
    a light concentrating assembly that amplifies inbound light and directs the light towards at least one solar power conversion assembly located within the housing;
    each solar power conversion assembly comprising:
        a power cell comprising a photovoltaic layer laminated upon a cell body wherein a portion of the photovoltaic layer on the cell body is exposed to the inbound light and a portion of the photovoltaic layer on the cell body faces the lower surface of the station housing;
        a first series of power cells arranged along a plane which is generally perpendicular to the concentrated direction of the light,
        wherein the power cells have a longitudinal axis which extends radially from an axis parallel to the concentrated direction of the light, and
        a drive apparatus engaging with the first series of power cells causing the power cells to rotate about their longitudinal axis rotating each of the power cells wherein the portion of the photovoltaic layer on the cell body previously directed to the lower surface of the station is rotated to be exposed to the incoming light and the photovoltaic layer on the cell body previously exposed to the incoming light is rotated to face the lower surface of the station.

9. A solar power collecting station as recited in claim 8, wherein the first series of power cells collectively rotates about the axis parallel to the concentrated direction of the light.

10. A solar power collecting station as recited in claim 9, wherein the drive apparatus drives each of power cells to rotate about their longitudinal axis and the first series of power cells to collectively rotate about the axis parallel to the concentrated direction of the light.

11. A solar power collecting station as recited in claim 8, the station further comprising a cooling apparatus which cools a portion of the photovoltaic layer of the power cell which is rotated away from exposure to the concentrated light.

12. A solar power collecting station as recited in claim 11, wherein the cooling apparatus is a fan.

13. A solar power collecting station as recited in claim 8, wherein the power cells are conically shaped, wherein the conical axis extends the their longitudinal axis.

14. A solar power collecting station as recited in claim 8, the station further comprising a second series of power cells being having attributes as the first series of power cells, the second series of power cells being parallel to and below the first planar layer.

15. A solar power collecting station as recited in claim 14, wherein the power cells of the second series of power cells are staggered respective to the power cells of the first series of power cells.

16. A solar power collecting station, the station comprising:
    a solar converting station housing;
    a light concentrating assembly that amplifies inbound light and directs the light towards at least one solar power conversion assembly located within the housing;
    each solar power conversion assembly comprising:
        a power cell comprising a photovoltaic layer laminated upon a cell body wherein a portion of the photovoltaic layer on the cell body is exposed to the inbound light and a portion of the photovoltaic layer on the cell body faces the lower surface of the station housing;
        a first series of power cells arranged along a plane which is generally perpendicular to the concentrated direction of the light,
        wherein the power cells have a longitudinal axis which extends radially from an axis parallel to the concentrated direction of the light, and a drive apparatus engaging with the first series of power cells causing the power cells to rotate about their longitudinal axis; and wherein the first series of power cells collectively rotates about the axis parallel to the concentrated direction of the light rotating each of the power cells wherein the portion of the photovoltaic layer on the cell body previously directed to the lower surface of the station is rotated to be exposed to the incoming light and the photovoltaic layer on the cell body previously exposed to the incoming light is rotated to face the lower surface of the station.

17. A solar power collecting station as recited in claim 16, wherein the drive apparatus drives each of power cells to rotate about their longitudinal axis and the first series of power cells to collectively rotate about the axis parallel to the concentrated direction of the light.

18. A solar power collecting station as recited in claim 16, the station further comprising a cooling apparatus which cools a portion of the photovoltaic layer of the power cell which is rotated away from exposure to the concentrated light.

19. A solar power collecting station as recited in claim 16, wherein the power cells are conically shaped, wherein the conical axis extends the their longitudinal axis.

20. A solar power collecting station as recited in claim 16, the station further comprising a second series of power cells being having attributes as the first series of power cells, the second series of power cells being parallel to and below the first planar layer.

21. A solar power collecting station as recited in claim 20, wherein the power cells of the second series of power cells are staggered respective to the power cells of the first series of power cells.

* * * * *